United States Patent
Wu

(10) Patent No.: US 7,319,731 B2
(45) Date of Patent: Jan. 15, 2008

(54) HIGH PRECISION CONTINUOUS TIME $G_M C$ BPF TUNING

(75) Inventor: Stephen Wu, Fountain Valley, CA (US)

(73) Assignee: Broadcom Corporation, Irvine, CA (US)

( * ) Notice: Subject to any disclaimer, the term of this patent is extended or adjusted under 35 U.S.C. 154(b) by 677 days.

(21) Appl. No.: 10/805,915

(22) Filed: Mar. 22, 2004

(65) Prior Publication Data

US 2005/0175136 A1     Aug. 11, 2005

Related U.S. Application Data

(60) Provisional application No. 60/542,124, filed on Feb. 5, 2004.

(51) Int. Cl.
    *H03D 3/24*      (2006.01)
(52) U.S. Cl. .................. 375/376; 375/229; 375/373; 375/374
(58) Field of Classification Search ................ 375/316, 375/322, 324, 354, 371, 373, 374, 375, 376; 327/524, 551, 552, 554, 555, 557
See application file for complete search history.

(56) References Cited

U.S. PATENT DOCUMENTS

| | | | | |
|---|---|---|---|---|
| 4,019,148 A | * | 4/1977 | Shawhan | 327/554 |
| 5,272,452 A | * | 12/1993 | Adachi et al. | 331/17 |
| 5,534,943 A | * | 7/1996 | Hwang | 348/724 |
| 5,550,520 A | * | 8/1996 | Kobayashi | 333/213 |
| 6,198,354 B1 | * | 3/2001 | Reinhardt et al. | 331/17 |
| 2002/0008572 A1 | * | 1/2002 | Hayashi et al. | 327/552 |
| 2002/0011896 A1 | * | 1/2002 | Yokoyama et al. | 327/552 |

* cited by examiner

*Primary Examiner*—Chieh M. Fan
*Assistant Examiner*—Naheed Ejaz
(74) *Attorney, Agent, or Firm*—Garlick Harrison & Markison; Shayne X. Short

(57) ABSTRACT

High precision continuous time $g_m C$ BPF (Band Pass Filter) tuning. A novel approach is presented by which a continuous time signal serves as a BPF control voltage for tuning of a BPF within a communication device (e.g., transceiver or receiver). A PLL (Phase Locked Loop) tunes the center frequency of the BPF using this continuous time signal, and the PLL oscillates at the center frequency of the BPF. The BPF is implemented as a $g_m C$ (transconductance-capacitance) filter, and the PLL is implemented using a number of $g_m$ (transconductance) cells as well. The PLL's $g_m$ cells and the BPF's $g_m$ cells are substantially identical in form. All of these $g_m$ cells are operated within their respective linear regions. This similarity of $g_m$ cells within the PLL and the BPF provide for substantial immunity to environmental perturbations including temperature and humidity changes as well as fluctuations of power supply voltages.

20 Claims, 6 Drawing Sheets

PLL (Phase Locked Loop): a high precision continuous time tuning circuit (determines tuning frequency of BPF)

communication system

PLL (Phase Locked Loop): a high precision continuous time tuning circuit (determines tuning frequency of BPF)

method for performing continuous time tuning to a BPF (Band Pass Filter)

HIGH PRECISION CONTINUOUS TIME $G_MC$ BPF TUNING

CROSS REFERENCE TO RELATED PATENTS/PATENT APPLICATIONS

The present U.S. Utility patent application claims priority pursuant to 35 U.S.C. § 119(e) to the following U.S. Provisional Patent Application which is hereby incorporated herein by reference in its entirety and made part of the present U.S. Utility patent application for all purposes:
1. U.S. Provisional Application Ser. No. 60/542,124, entitled "High precision continuous time $g_mC$ BPF tuning,", filed Feb. 5, 2004 (Feb. 5, 2004), pending.

BACKGROUND OF THE INVENTION

1. Technical Field of the Invention

The invention relates generally to communication devices; and, more particularly, it relates to filter tuning within of such communication devices.

2. Description of Related Art

Data communication systems have been under continual development for many years. Within many communication devices implemented within such communication systems, there is often a need for tuning into a particular frequency for appropriate demodulation of a signal for subsequent decoding of the information that is included therein. In many such instances, a BPF (Band Pass Filter) is employed to assist in the selection of a signal at a particular frequency of range of frequencies; such a BPF can oftentimes be found in the receive path of a communication device.

A typical prior art approach to tuning a BPF, within such communication devices, that is used to select an appropriate frequency for demodulation of a signal for subsequent decoding and extraction of the information included therein is to use digital control words to control the BPF center frequency to avoid any problem of spur/glitches that may be existent in a BPF control voltage that may be used to tune the BPF. Oftentimes, the BPF is a digitally programmable device that receives the digital control word (sometimes referred to as a FCW or "Frequency Control Word") to select and tune the BPF at the appropriate frequency. Such a digital approach inherently introduces a degree of quantization error whose resolution is governed by the LSB (Least Significant Bit) of the digitally provided FCW. This quantization error is inherent to any digitally controlled system.

Another prior art approach to tuning a BPF is to use a PLL (Phase Locked Loop) that oscillates at a frequency that is substantially different than the center frequency to which the BPF is to be tuning. When a control voltage signal is selected from such a prior art implementation of a PLL that is used to tune the BPF, it typically includes a large amount of spur/glitch content that coincides with the clock frequency of the REF IN (REFerence IN) signal to which the PLL locks onto. Prior art approaches to using a PLL to provide a control voltage signal oftentimes introduce spurs and glitches within the control voltage signal outside of the bandwidth of the BPF. As such, it can be seen that there are many disadvantages and limitations of the typical prior art approaches to tuning a BPF. Clearly, there is a need in the art for a more effective and efficient way of doing so.

BRIEF SUMMARY OF THE INVENTION

Various aspects of the invention can be found in a PLL (Phase Locked Loop) that is implemented to perform high precision continuous time BPF (Band Pass Filter) tuning. Such a BPF may be found within the receive path of a communication device. A continuous time signal, a BPF control voltage, is selected from an appropriate portion of the PLL such that it is substantially immune from glitches and spurs. The PLL that provides this BPF control voltage includes a PFD (Phase/Frequency Detector), a CP (Charge Pump), a loop filter, a VCO (Voltage Controlled Oscillator), and an amplitude detector. The PFD is operably coupled to determine a phase difference between transitions of a feedback signal and an input signal. The CP is operably coupled to convert the phase difference into a charge pump current. The loop filter operably is communicatively coupled to convert the charge pump current into a VCO control voltage. The VCO is operably coupled to convert the VCO control voltage into a recovered clock such that the feedback signal is derived from the recovered clock. The VCO is implemented using a plurality of $g_m$ (transconductance) cells. The amplitude detector detects an amplitude of the recovered clock and that biases the plurality of $g_m$ cells of the VCO such that the each $g_m$ cell of the plurality of $g_m$ cells operates substantially within its linear operating region. The loop filter may be implemented as a LPF (Low Pass Filter) having a resistor and a capacitor connected in series such that the capacitor is shunted to ground. The BPF control voltage is selected from a node that connects the resistor and the capacitor, and the BPF control voltage determines a tuning frequency of a BPF to which the PLL is communicatively coupled.

In certain embodiments, the BPF is implemented as a $g_mC$ (transconductance-capacitance) filter that includes another plurality of $g_m$ cells. The plurality of $g_m$ cells of the VCO and the plurality of $g_m$ cells of the $g_mC$ filter may be implemented such that they both include substantially identical $g_m$ cells. The tuning frequency of the BPF is selected to be substantially a center frequency of the BPF, and the BPF control voltage biases the plurality of $g_m$ cells of the VCO such that the each of those $g_m$ cell also operates substantially within its linear operating region. By providing that the $g_m$ cells of the VCO and the BPF are substantially identical, the communication device can provide substantial immunity to environmental perturbation of the PLL and the BPF. Some examples of these environmental perturbations include temperature change and/or humidity change that may also precipitate a change in a power supply voltage level (e.g., the power supply that is used to power one or more of the various components of the communication device). Changes in such a power supply voltage level may also be viewed as falling under the umbrella of environmental perturbations as well. The input signal that is provided to the PFD may also be selected to be substantially the center frequency of the BPF; this way, the PLL oscillates at substantially the center frequency of the BPF as well. The BPF control voltage is selected from a particular node within the PLL such that the loop filter of the PLL substantially eliminates any spur or glitch content within the BPF control voltage. In addition, the fact that the BPF control voltage is a continuous time analog voltage signal also ensures that the precision of the BPF control voltage is highly accurate. Also, this PLL, and the BPF that the PLL tunes, may be implemented within an AFE (Analog Front End) of a communication device.

The invention envisions any type of communication devices that supports the functionality and/or processing described herein. Moreover, various types of methods may be performed to support the functionality described herein without departing from the scope and spirit of the invention as well.

DETAILED DESCRIPTION OF THE INVENTION

Figure 1:
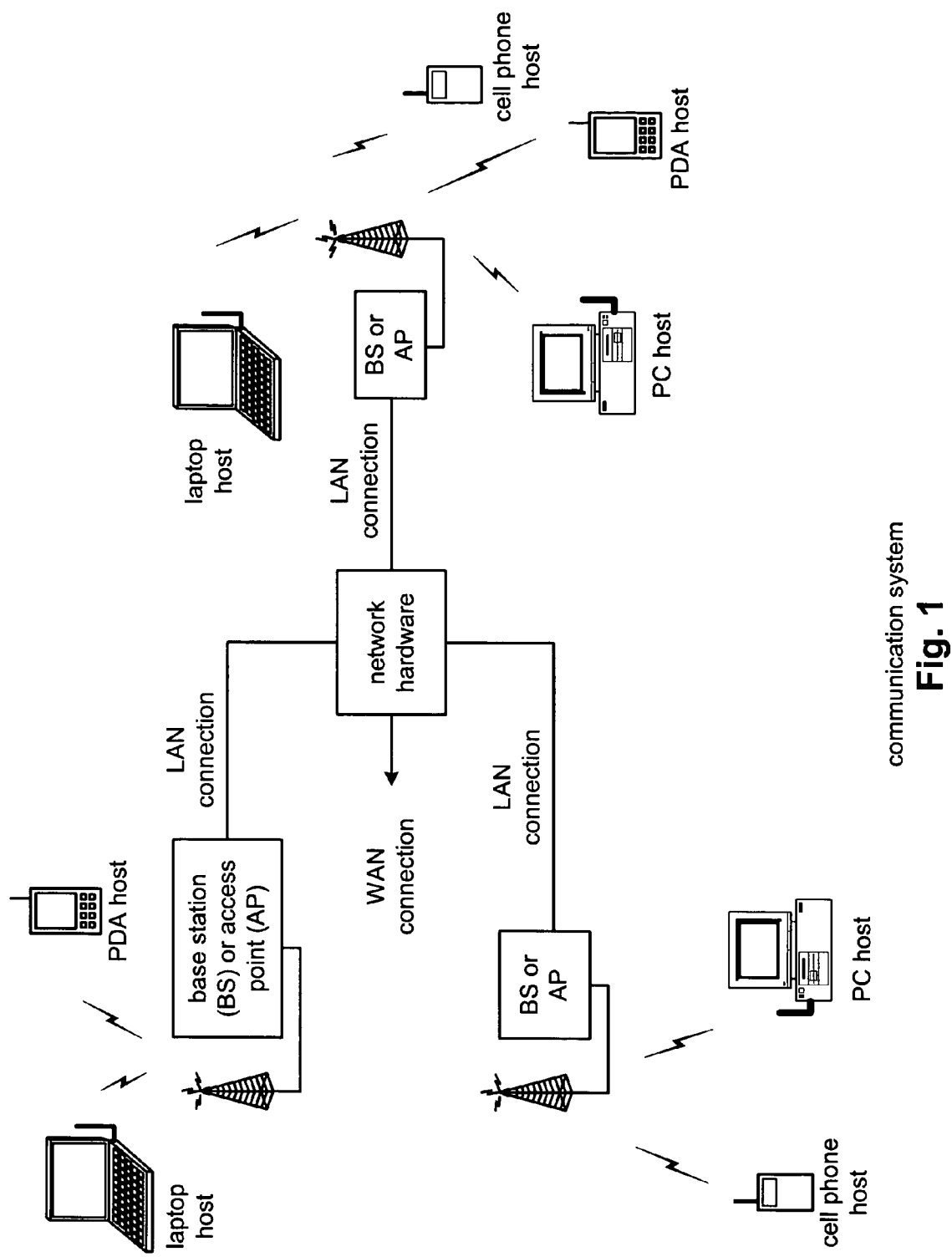
FIG. 1 is a schematic block diagram illustrating a communication system that includes a plurality of base stations and/or access points, a plurality of wireless communication devices and a network hardware component in accordance with certain aspects of the invention.

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE (Institute of Electrical & Electronics Engineers) 802.11, Bluetooth®, AMPS (Advanced Mobile Phone Services), digital AMPS, GSM (Global System for Mobile communications), CDMA (Code Division Multiple Access), LMDS (Local Multi-point Distribution Systems), MMDS (Multi-channel-Multi-point Distribution Systems), and/or variations thereof.

Depending on the type of wireless communication system, a wireless communication device, such as a cellular telephone, two-way radio, PDA (Personal Digital Assistant), PC (Personal Computer), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of RF (Radio Frequency) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a PA (Power Amplifier). The data modulation stage converts raw data into baseband signals in accordance with a particular wireless communication standard. The one or more intermediate frequency stages mix the baseband signals with one or more local oscillations to produce RF signals. The PA amplifies the RF signals prior to transmission via an antenna.

As is also known, the receiver is coupled to the antenna and includes a LNA (Low Noise Amplifier), one or more intermediate frequency stages, a filtering stage, and a data recovery stage. The LNA receives inbound RF signals via the antenna and amplifies them. The one or more intermediate frequency stages mix the amplified RF signals with one or more local oscillations to convert the amplified RF signal into baseband signals or IF (Intermediate Frequency) signals. The filtering stage filters the baseband signals or the IF signals to attenuate unwanted out of band signals to produce filtered signals. The data recovery stage recovers raw data from the filtered signals in accordance with the particular wireless communication standard.

A novel approach is presented to provide for the tuning of the center frequency of a BPF (Band Pass Filter) within a communication device. A high precision continuous time tuning circuit provides a continuous time, analog BPF control voltage, from an appropriately arranged and sampled PLL (Phase Locked Loop). The BPF control voltage is selected from a particular node within the PLL such that the signal is substantially free of any glitch/spur content. This BPF control voltage is used to determine the tuning frequency of the BPF. The BPF can be implemented as a $g_m C$ (transconductance-capacitance) filter. Appropriate $g_m$ cell components of the PLL are also implemented using the same type of $g_m$ cells that are implemented within the BPF. That is to say, the $g_m$ cells within the $g_m C$ implemented BPF filter are substantially identical to the $g_m$ cells used to implement the VCO (Voltage Controlled Oscillator) of the PLL that is used to provide the BPF control voltage to tune the PLL.

This newly present PLL, implemented as a tuning circuit for the BPF, provides a continuous time control signal that directs the center frequency to which the BPF tunes. The BPF control voltage is selected from a particular location within the loop filter of the PLL to borrow upon the inherent filtering provided by the PLL's loop filter to eliminate the spur/glitch content of that particular signal. In addition, it is noted that the $g_m$ cells of the VCO of the PLL and the $g_m$ cells of the BPF (that is implemented as a $g_m C$ filter) are substantially identical in nature. An amplitude detector detects the amplitude of the VCO output signal and provides a feedback signal to the VCO so that the VCO may be biased to an appropriate operating point such that the $g_m$ cells of the VCO operate within their linear region. This feedback signal, provided from the amplitude detector, directly ensures that the $g_m$ cells of the VCO operate within their linear region. This amplitude detector functionality also indirectly ensures that the $g_m$ cells of the BPF also operate within their respective linear region.

The PLL and BPF arrangement may be implemented within any number of communication devices that may be implemented within any variety of communication systems. For example, the functionality of the invention may be found in variety of communication devices including those that operate according to the wireless Bluetooth® communication standard and other wireless standards including the various standards and recommended practices that are provided under the umbrella of the IEEE (Institute of Electrical & Electronics Engineers) 802.15 working group (e.g., including the IEEE 802.15.1 Bluetooth® core, the IEEE 802.15.2 recommended practice specification, the IEEE 802.15.3 high data rate PAN standard, and the IEEE 802.15.3 WPAN (Wireless Personal Area Network) High Rate Alternative PHY Task Group 3a (TG3a) which is sometimes referred to the IEEE 802.15.3a extended high data rate PAN standard). Moreover, the functionality of the invention may be implemented within a variety of types of communication devices including those operable within various wireline and/or wireless based communication systems. This functionality may also be implemented within a monolithic single chip design of an integrated circuit that may be employed within a wireless (e.g., Bluetooth®) mouse, keyboard, or other type peripheral type device that is part of a larger computer type system.

FIG. 1 is a schematic block diagram illustrating a communication system that includes a plurality of base stations and/or access points, a plurality of wireless communication devices and a network hardware component in accordance with certain aspects of the invention. The wireless communication devices may be laptop host computers, PDA (Personal Digital Assistant) hosts, personal computer hosts and/or cellular telephone hosts. The details of the wireless communication devices are described in greater detail with reference to FIG. 2 below.

The base stations or access points are operably coupled to the network hardware via the respective local area network connections. The network hardware, which may be a router, switch, bridge, modem, system controller, et cetera, provides a wide area network connection for the communication system. Each of the base stations or access points has an associated antenna or antenna array to communicate with the wireless communication devices in its area. Typically, the wireless communication devices register with a particular base station or access point to receive services from the communication system. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
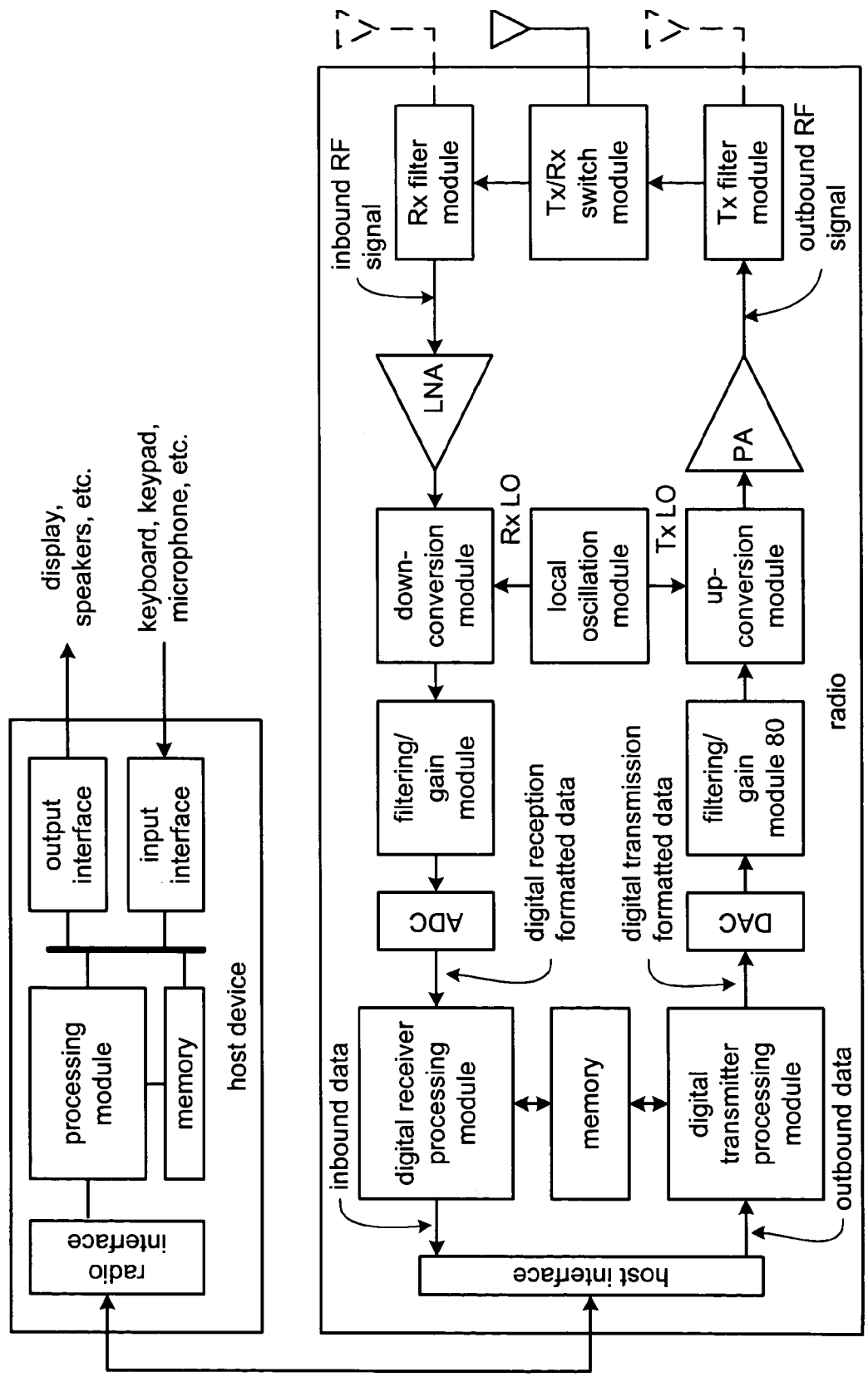
FIG. 2 is a schematic block diagram illustrating a wireless communication device that includes the host device and an associated radio in accordance with certain aspects of the invention.

FIG. 2 is a schematic block diagram illustrating a wireless communication device that includes the host device and an associated radio in accordance with certain aspects of the invention. For cellular telephone hosts, the radio is a built-in component. For personal digital assistants hosts, laptop hosts, and/or personal computer hosts, the radio may be built-in or an externally coupled component.

As illustrated, the host device includes a processing module, memory, radio interface, input interface and output interface. The processing module and memory execute the corresponding instructions that are typically done by the host device. For example, for a cellular telephone host device, the processing module performs the corresponding communication functions in accordance with a particular cellular telephone standard.

The radio interface allows data to be received from and sent to the radio. For data received from the radio (e.g., inbound data), the radio interface provides the data to the processing module for further processing and/or routing to the output interface. The output interface provides connectivity to an output display device such as a display, monitor, speakers, et cetera such that the received data may be displayed. The radio interface also provides data from the processing module to the radio. The processing module may receive the outbound data from an input device such as a keyboard, keypad, microphone, et cetera via the input interface or generate the data itself. For data received via the input interface, the processing module may perform a corresponding host function on the data and/or route it to the radio via the radio interface.

The radio includes a host interface, a digital receiver processing module, an ADC (Analog to Digital Converter), a filtering/gain module, an IF (intermediate Frequency) mixing down conversion stage, a receiver filter, an LNA (Low Noise Amplifier), a transmitter/receiver switch, a local oscillation module, memory, a digital transmitter processing module, a DAC (Digital to Analog Converter), a filtering/gain module, an IF mixing up conversion stage, a PA (Power Amplifier), a transmitter filter module, and an antenna. The antenna may be a single antenna that is shared by the transmit and the receive paths as regulated by the Tx/Rx switch, or may include separate antennas for the transmit path and receive path. The antenna implementation will depend on the particular standard to which the wireless communication device is compliant.

The digital receiver processing module and the digital transmitter processing module, in combination with operational instructions stored in memory, execute digital receiver functions and digital transmitter functions, respectively. The digital receiver functions include, but are not limited to, digital IF (Intermediate Frequency) to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules may be implemented using a shared processing device, individual processing devices, or a plurality of processing devices. Such a processing device may be a microprocessor, microcontroller, DSP (Digital Signal Processor), microcomputer, CPU (Central Processing Unit), FPGA (Field Programmable Gate Array), programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a ROM (Read Only Memory), RAM (Random Access Memory), volatile memory, non-volatile memory, static memory, dynamic memory, flash memory, and/or any device that stores digital information. It is noted that when either of the digital receiver processing module or the digital transmitter processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio receives outbound data from the host device via the host interface. The host interface routes the outbound data to the digital transmitter processing module, which processes the outbound data in accordance with a particular wireless communication standard (e.g., IEEE (Institute of Electrical & Electronics Engineers) 802.11, Bluetooth®, et cetera) to produce digital transmission formatted data. The digital transmission formatted data is a digital base-band signal or a digital low IF signal, where the low IF typically will be in the frequency range of one hundred kHz (kilo-Hertz) to a few MHz (Mega-Hertz).

The DAC converts the digital transmission formatted data from the digital domain to the analog domain. The filtering/gain module filters and/or adjusts the gain of the analog signal prior to providing it to the IF mixing stage. The IF mixing stage converts the analog baseband or low IF signal into an RF signal based on a transmitter local oscillation provided by local oscillation module. The PA amplifies the RF signal to produce outbound RF signal, which is filtered by the transmitter filter module. The antenna transmits the outbound RF signal to a targeted device such as a base station, an access point and/or another wireless communication device.

The radio also receives an inbound RF signal via the antenna, which was transmitted by a base station, an access point, or another wireless communication device. The antenna provides the inbound RF signal to the receiver filter module via the Tx/Rx switch, where the Rx filter bandpass filters the inbound RF signal. The Rx filter provides the filtered RF signal to the LNA, which amplifies the signal to produce an amplified inbound RF signal. The LNA provides the amplified inbound RF signal to the IF mixing module, which directly converts the amplified inbound RF signal into an inbound low IF signal or baseband signal based on a receiver local oscillation provided by local oscillation module. The down conversion module provides the inbound low IF signal or baseband signal to the filtering/gain module. The filtering/gain module filters and/or gains the inbound low IF signal or the inbound baseband signal to produce a filtered inbound signal.

The ADC converts the filtered inbound signal from the analog domain to the digital domain to produce digital reception formatted data. The digital receiver processing module decodes, descrambles, demaps, and/or demodulates the digital reception formatted data to recapture inbound data in accordance with the particular wireless communication standard being implemented by radio. The host interface provides the recaptured inbound data to the host device via the radio interface.

As one of average skill in the art will appreciate, the wireless communication device of FIG. 2 may be implemented using one or more integrated circuits. For example, the host device may be implemented on one integrated circuit, the digital receiver processing module, the digital transmitter processing module and memory may be implemented on a second integrated circuit, and the remaining components of the radio, less the antenna, may be implemented on a third integrated circuit. As an alternate example, the radio may be implemented on a single integrated circuit. As yet another example, the processing module of the host device and the digital receiver and transmitter processing modules may be a common processing device implemented on a single integrated circuit. Further, the memories of the host device and the radio may also be implemented on a single integrated circuit and/or on the same integrated circuit as the common processing modules of processing module of the host device and the digital receiver and transmitter processing module of the radio.

Figure 3:
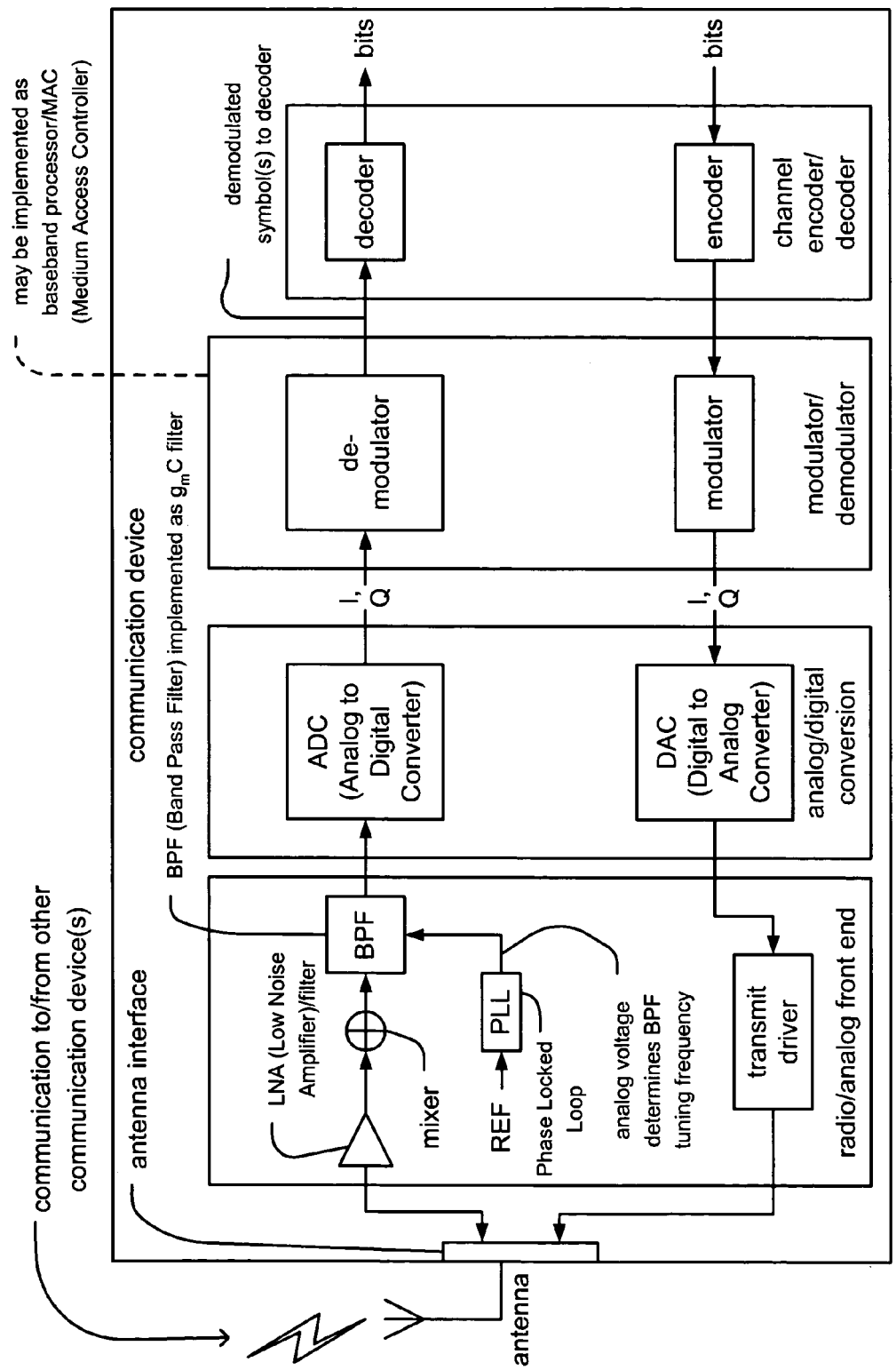
FIG. 3 is a diagram illustrating an embodiment of a communication device (shown in transceiver embodiment) that is built according to the invention.

FIG. 3 is a diagram illustrating an embodiment of a communication device that is built according to the invention. This embodiment shows a communication system that is capable of being implemented within a wireless type communication system; however, such a communication device could alternatively be implemented within a wireline type communication system as well without departing from the scope and spirit of the invention.

Being shown in a wireless context, this embodiment of a communication device includes an antenna that is operable to communicate with any 1 or more other communication devices within a given communication network. An antenna interface communicatively couples a signal to be transmitted from the communication device or a signal received by the communication device to the appropriate path (be it the transmit path or the receive path).

A radio/analog front end (that may also be referred to as "radio front end" or "analog front end") includes both receiver functionality and transmitter functionality. The radio front end communicatively couples to an analog/digital conversion functional block. The radio front end communicatively couples to a modulator/demodulator, and the radio front end communicatively couples to a channel encoder/decoder.

Along the Receive Path:

The receiver functionality of the radio/analog front end includes a LNA (Low Noise Amplifier)/filter. The LNA/filter is followed by a mixer that is operable to perform any modification in frequency of the received signal. Using the mixer, the receiver functionality of the front end performs any down-converting that may be requiring from a carrier frequency by which the received signal was transmitted. This may be performed by converting first down to an IF (Intermediate Frequency), or it may alternatively include down-converting directing from the received signal to a baseband signal. In addition, the mixer is followed by a BPF (Band Pass Filter) that is operable to tune the tuning frequency of the radio/analog front end to the appropriate frequency and therefore the appropriate channel.

Whichever particular manner is employed, a baseband signal is output from the receiver functionality of the radio/analog front end and is provided to an ADC (Analog to Digital Converter) that outputs the digital I, Q (In-phase, Quadrature) components of the baseband signal.

These I, Q components are provided to a demodulator portion of the modulator/demodulator where any modulation decoding/symbol mapping is performed where the digitally sampled received symbol is mapped to an appropriate modulation (that includes a constellation and corresponding mapping). Examples of such modulations may include BPSK (Binary Phase Shift Key), QPSK (Quadrature Phase Shift Key), 8 PSK (8 Phase Shift Key), 16 QAM (16 Quadrature Amplitude Modulation), and even higher order modulation types. The appropriately mapped symbols are then provided to a decoder portion of the channel encoder/decoder where best estimates of the information bits contained within the received symbols are made.

Along the Transmit Path:

Somewhat analogous and opposite processing is performed in the transmit path when compared to the receive path. Information bits that are to be transmitted are encoded using an encoder of the channel encoder/decoder. These encoded bits are provided to a modulator of the modulator/demodulator where modulation encoding/symbol mapping may be performed according to the modulation of interest.

These now I, Q components of the symbols are then passed to a DAC (Digital to Analog Converter) of the analog/digital conversion functional block. The now analog signal to be transmitted is then passed to a transmit driver that performs any necessary up-converting/modification to the analog signal to comport it to the communication channel over which the signal is to be transmitted to another communication device via the antenna.

The radio/analog front end also includes a PLL (Phase Locked Loop) that is implemented to perform as a high precision continuous time $g_mC$ (transconductance-capacitance) tuning circuit that determines the tuning frequency of a BPF (Band Pass Filter) within the radio/analog front end, that is built according to the invention. Again, the BPF within the radio/analog front end tunes the received signal to the appropriate channel when operating cooperatively with the remaining portions of the radio/analog front end to output a baseband signal to the ADC.

While this PLL, implemented to perform as a high precision continuous time $g_mC$ tuning circuit that determines the tuning frequency of a BPF within the radio/analog front end, is shown as being within a transceiver type embodiment, it is noted that such a PLL, implemented to perform as a high precision continuous time $g_mC$ tuning circuit, may be implemented within any other type of communication device including communication receivers.

Figure 4:
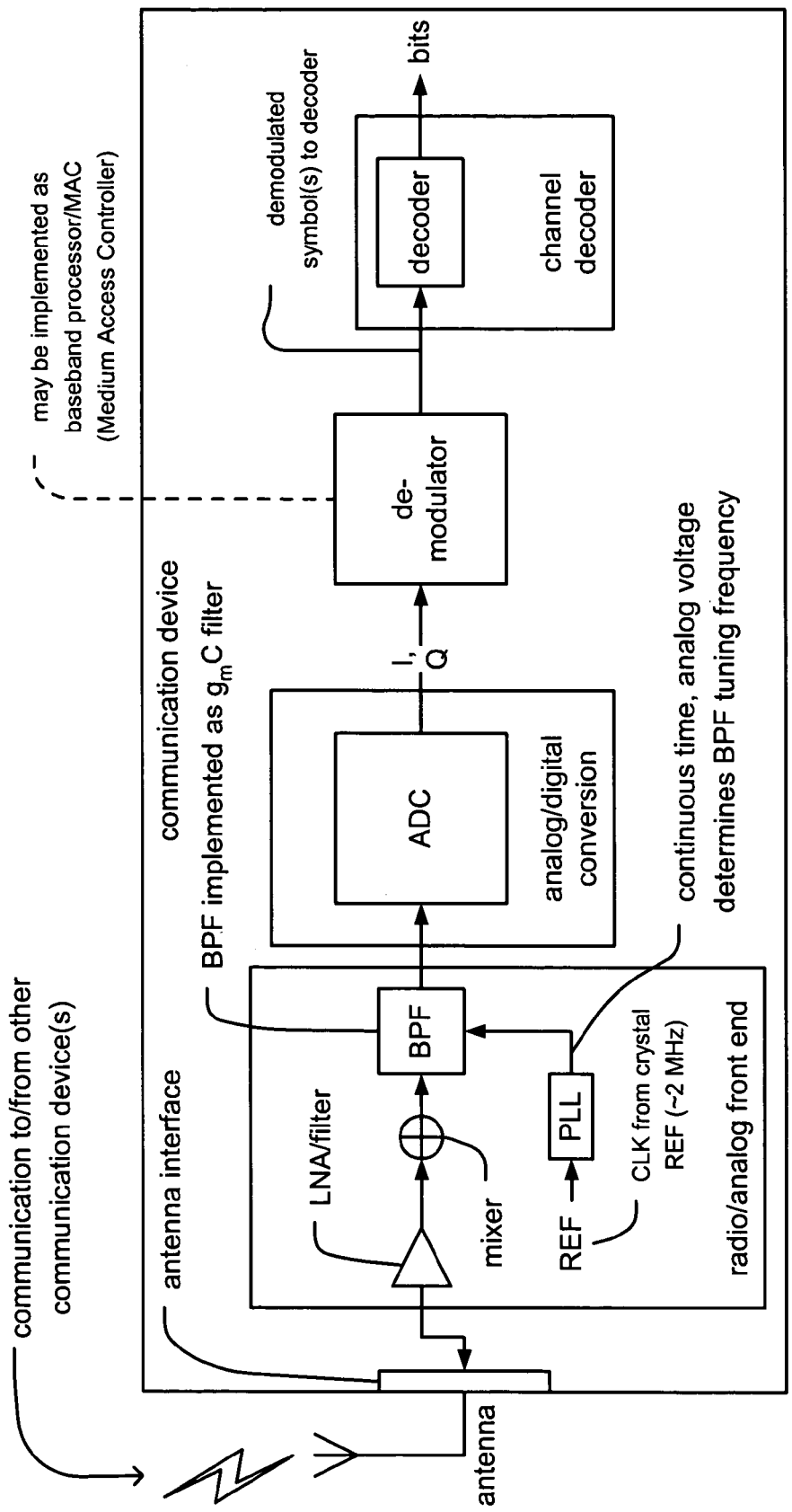
FIG. 4 is a diagram illustrating an embodiment of a communication device (shown in receiver embodiment) that is built according to the invention.

FIG. 4 is a diagram illustrating an embodiment of a communication device (shown in receiver embodiment) that is built according to the invention. In this embodiment, only a receive path is shown as this communication device is a communication receiver. This communication device includes the same elements as within the receive path of the previous embodiment.

For example, the receiver functionality of the radio/analog front end also includes a LNA/filter. The LNA/filter is followed by a mixer that is operable to perform any modification in frequency of the received signal. Using the mixer, the receiver functionality of the front end performs any down-converting that may be requiring from a carrier frequency by which the received signal was transmitted. This may be performed by converting first down to an IF, or it may alternatively include down-converting directing from the received signal to a baseband signal. In addition, the mixer is followed by a BPF that is operable to tune the tuning frequency of the radio/analog front end to the appropriate frequency and therefore the appropriate channel.

Whichever particular manner is employed, a baseband signal is output from the receiver functionality of the radio/analog front end and is provided to an ADC that outputs the digital I, Q components of the baseband signal.

These I, Q components are provided to a demodulator where any modulation decoding/symbol mapping is performed where the digitally sampled received symbol is mapped to an appropriate modulation (that includes a constellation and corresponding mapping). Again, examples of such modulations may include BPSK, QPSK, 8 PSK, 16 QAM, and even higher order modulation types. The appropriately mapped symbols are then provided to a decoder portion of the channel decoder where best estimates of the information bits contained within the received symbols are made.

In general, the PLL that is implemented to perform as a high precision continuous time $g_mC$ tuning circuit may be included within any type of communication device to assist in an improved approach to perform BPF tuning.

Figure 5:
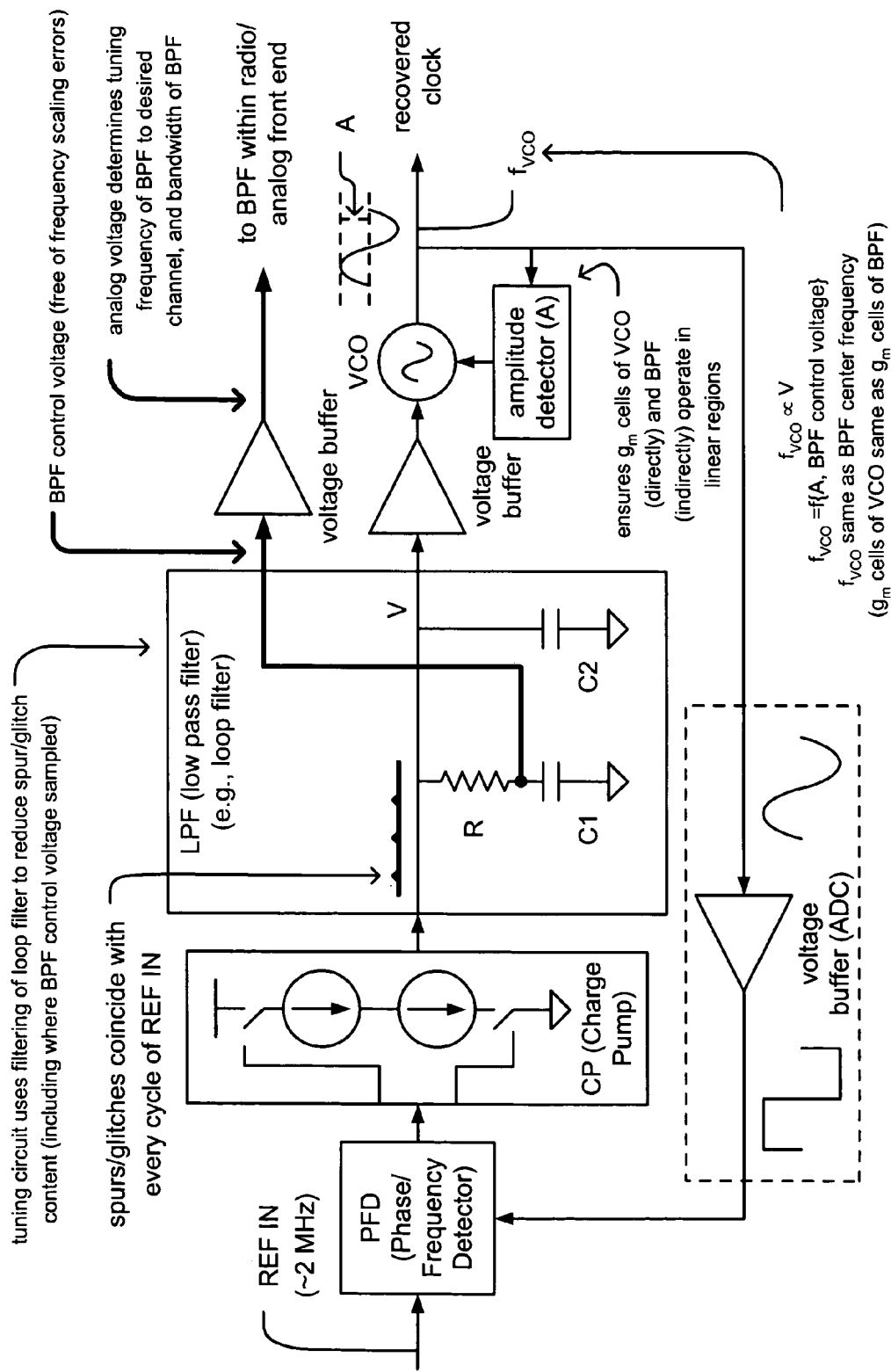
FIG. 5 is a diagram illustrating an embodiment of a PLL (Phase Locked Loop), implemented to perform as a high precision continuous time tuning circuit that determines the tuning frequency of a BPF (Band Pass Filter), that is built according to the invention.

FIG. 5 is a diagram illustrating an embodiment of a PLL (Phase Locked Loop), implemented to perform as a high precision continuous time $g_mC$ (transconductance-capacitance) tuning circuit that determines the tuning frequency of a BPF, that is built according to the invention.

Generally speaking, the high precision continuous time $g_mC$ tuning circuit is implemented as a PLL. In this embodiment, an input signal (shown as a REF IN signal or a REF IN signal) is employed as the trigger to the PLL. If desired, this REF IN signal is derived from an on-chip crystal to generate a signal having a frequency of approximately 2 MHz (Mega-Hertz) (e.g., $\propto 2$ MHz). This data signal is passed to a PFD (Phase/Frequency Detector) that generates a voltage proportional to a phase difference between the REF IN and the recovered clock/feedback signal (output from a VCO (Voltage Controlled Oscillator)).

The PFD is operably coupled to determine a phase difference between transitions of the incoming signal, REF IN, (e.g., the incoming signal by which the PLL is triggered) and a feedback signal. This feedback signal is a signal that is derived from the recovered clock (as described in more detail below).

The output of the PFD is provided to control a CP (Charge Pump). The CP operates to convert the phase difference detected by the PFD into a charge pump current. The CP delivers either positive or negative charge pulses depending on whether the reference signal phase leads or lags a feedback signal generated from a VCO signal. The VCO is operably coupled to convert a control voltage provided from the CP into a recovered clock. The output of the CP is applied to a loop filter that may be implemented as a LPF (Low Pass Filter) (e.g., shown as using a resistor, R, and a capacitor, C1, shunted to ground; the LPF may also include another capacitor, C2, shunted to ground to compensate for any undesirable parasitics). If desired, these capacitors may be implemented as MOS (Metal Oxide Semiconductor) capacitor devices. The loop filter is operably coupled to convert the charge pump current into a control voltage. It is the loop filter that determines the dynamic characteristics of the PLL. The output of the loop filter is provided to drive the VCO after having passed through a voltage buffer.

The output signal from the VCO is the recovered clock. The recovered clock may be employed as a feedback signal (that passes through a voltage buffer that is implemented as an ADC converting the sine wave input signal to a square wave output signal), that is provided to the PFD. In some instance, this feedback signal is a divided version of the recovered clock output from the VCO as well.

The recovered clock output from the VCO, having a frequency shown as $f_{VCO}$, is also provided to an amplitude detector that detects the amplitude (shown as A) of the recovered clock and feeds it back to the VCO to ensure that the $g_m$ (transconductance) cells of the VCO operate within their linear region. That is to say, the biasing of the $g_m$ cells by which the VCO is constructed is ensured so that there are biased appropriately such that they operate as linear type devices.

It is also noted that the $g_m$ cells by which the VCO is constructed and the $g_m$ cells by which the BPF is constructed are of the same type. That is to say, the unit $g_m$ cells are replicated for both of these functional blocks. The $g_m$ cells of the VCO and of the BPF are of the same processing, the same type, the same size, and so on. Since the amplitude detector ensures that the $g_m$ cells of the VCO operate within their respective linear region, and since the $g_m$ cells of the BPF are of the same type of $g_m$ cells, the $g_m$ cells of the BPF also operate within their linear respective region. It is noted that the frequency of the VCO, shown as $f_{VCO}$, is a function of the amplitude of the recovered clock (A), that is ascertained by the amplitude detector, and also a BPF control voltage. The BPF control voltage is passed through a voltage buffer whose output is used to determine the tuning frequency of the BPF to tune to a desired channel and also is also use to determine the bandwidth of the BPF as well. It is noted that the voltage buffers that drive the VCO and the BPF, respectively, are substantially identical buffers with minimal offset drive tuning voltages. In addition, since the BPF is not in the PLL loop, the RC (Resistance Capacitance) filtering in the loop filter is used to provide a BPF tuning voltage (e.g., the BPF control voltage) that has at least a reduction in any spurs/glitches within the REF IN signal by a factor of 20 dB (decibels). By tuning the BPF center frequency in the manner described herein, the BPF performance is not affected by any spurs/glitches in the tuning circuit.

As the biasing of the $g_m$ cells of the VCO is changed, based on any changing of the biasing feedback signal provided from the amplitude detector, the frequency of the VCO, $f_{VCO}$, is also changed. As the frequency of the VCO, $f_{VCO}$, is also changed, the BPF control voltage is also changed accordingly. The continuous monitoring nature and modification of the analog voltage, output from the voltage buffer, that determines the tuning frequency of the BPF provides for a much improved approach to BPF tuning when compared to prior art approaches that often include using digital control.

If there are in fact spurs/glitches within the REF IN signal that is used to trigger the PLL, these spurs/glitches will show up in the voltage output from the CP that is provided to the loop filter. It is quite common that such spurs/glitches exist within the REF IN signal that may be generated by a local crystal. However, it is highly desirable that the BPF control voltage be substantially free, if not completely free, from undesirable spurs/glitches. The high precision continuous time $g_mC$ tuning circuit uses the existent loop filter of the PLL to reduce the spur/glitch content of the REF IN signal. By appropriately extracting the BPF control voltage from the appropriate location between the shunt resistor, R, and the capacitor, C1, the BPF control voltage is largely filtered and substantially immune from any spur/glitch content. In short, the circuit that operates as a continuous time $g_mC$ BPF tuning circuit (e.g., the PLL itself) uses the inherent filtering of the loop filter of the PLL to reduce the spur/glitch content of the BPF control voltage signal that is output from the CP when generating the BPF control voltage.

In general, the PLL that is used to tune the BPF center frequency provides a continuous time signal (e.g., an analog signal) such that the PLL is oscillating at the center frequency of the BPF without injecting spurs/glitches inside of the bandwidth of the BPF. The fact that the tuning frequency is centered in frequency (e.g., the VCO operating frequency is the same as the BPF center frequency), provides for improved performance when compared to prior art approaches. The BPF is appropriately tuned, via the BPF control voltage, to get the $g_m$ cells therein to operate in their respective linear region. Again, the $g_m$ cells of the VCO and the $g_m$ cells of the BPF are of the same type. These various physical constraints and operational parameters operate cooperatively to ensure that the communication device is largely immune to environmental changes (such as changes in temperature, humidity, and so on) as well as other operational changes (such as changes in power supply voltage, spurs/glitches in the power supply, and other fluctuations in the power supply voltage). Clearly, some of these include temperature change and/or humidity change and a change in a power supply voltage level (e.g., the power supply that is used to power one or more of the various components of the communication device) may also be precipitated by changes in the environment in which the communication device operates, and such changes may also be characterized as being under the umbrella of environmental changes as well.

The analog, continuous time approach to tune the center frequency of the BPF allows for the changing of the $g_m$ of the cells of the BPF using an analog voltage. For example, the BPF control voltage allows for different biasing of the $g_m$ cells of the BPF thereby allowing the ability always to ensure that the $g_m$ cells operate within their linear region. Also, since the tuning of the center frequency of the BPF is performed using an analog voltage, there is continuous updating and no quantization error; this is in contrast the tuning that would be performed using a digital control word that would be updating at various clock signal transitions (e.g., every so often and/or after the expiration of every predetermined period of time). Also, given the fact that the PLL is used to tune the BPF center frequency using the continuous, analog signal, the PLL is able to oscillate at the center frequency of the BPF without injecting any undesirable spurs/glitches inside of the operable bandwidth of the BPF. There are many benefits that are clearly seen borrowing upon this new approach to tuning of the center frequency of a BPF within a communication device including the immunity to environmental changes (e.g., temperature and humidity), the absence of any spurs/glitches in the BPF control voltage, and the inherently precise nature of the tuned BPF center frequency because of the analog nature by which the BPF control voltage is generated and provided to tune the center frequency of the BPF (e.g. no quantization error).

Figure 6:
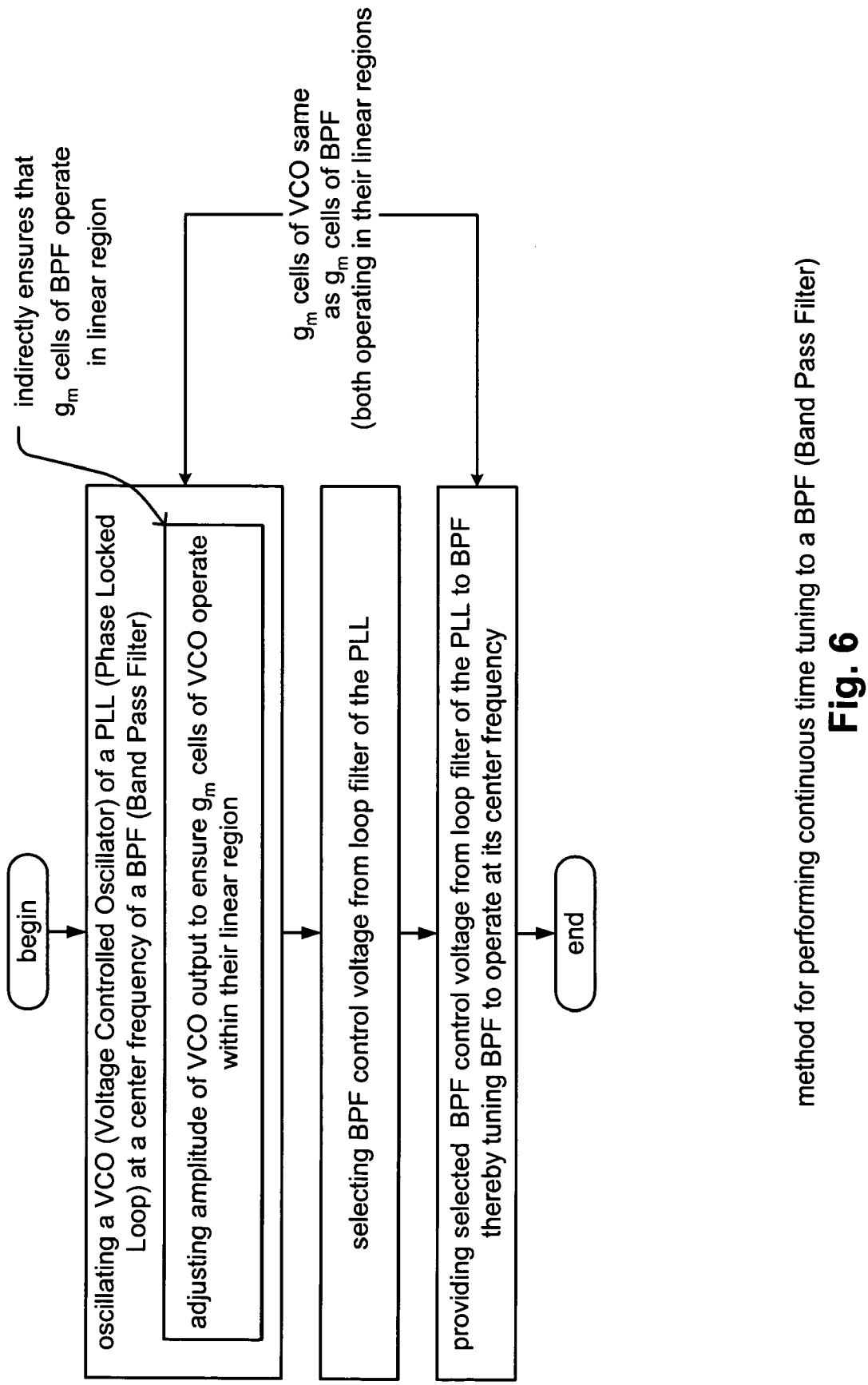
FIG. 6 is a flowchart illustrating an embodiment of a method for performing continuous time tuning of a BPF (Band Pass Filter) according to the invention.

FIG. 6 is a flowchart illustrating an embodiment of a method for performing continuous time tuning of a $g_mC$ (transconductance-capacitance) BPF (Band Pass Filter) according to the invention. The method involves oscillating a VCO (Voltage Controlled Oscillator) of a PLL (Phase Locked Loop) at a center frequency of a BPF (Band Pass Filter). This also involves adjusting the amplitude of the VCO output to ensure that the $g_m$ cells of the VCO operate within their linear region. The method also involves selecting a BPF control voltage from a particular portion within the loop filter of the PLL. By selecting the BPF control voltage from this appropriate portion of the loop filter of the PLL, the BPF control voltage is substantially free of any spur/glitch content. The method then also involves providing the selected BPF control voltage from the loop filter of the PLL to BPF thereby tuning the BPF to operate at its center frequency. It is noted that the $g_m$ cells of the VCO are constructed using the same type of cells and process as the $g_m$ cells of BPF. By operating them both at the same frequency (e.g., the center frequency of the BPF), it ensures that a precise BPF control voltage may be employed that is substantially free of any frequency scaling errors. This ensures a very accurate BPF control voltage for use in tuning the frequency of the BPF that is also substantially free immune to environmental perturbations (as also discussed above).

It is also noted that various methods may be performed, in accordance with the invention, in a manner similar to the operation and functionality of the various system and/or apparatus embodiments described above. In addition, such methods may be viewed as being performed within any of the appropriate system and/or apparatus embodiments (communication systems, communication transmitters, communication receivers, communication transceivers, and/or functionality described therein) that are described above without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. A PLL (Phase Locked Loop) implemented to perform high precision continuous time BPF (Band Pass Filter) tuning, the PLL comprising:
 a PFD (Phase/Frequency Detector) that is operably coupled to determine a phase difference between transitions of a feedback signal and an input signal;
 a CP (Charge Pump) operably coupled to convert the phase difference into a charge pump current;
 a loop filter operably coupled to convert the charge pump current into a VCO (Voltage Controlled Oscillator) control voltage;
 a VCO (Voltage Controlled Oscillator) operably coupled to convert the VCO control voltage into a recovered clock, wherein the feedback signal is derived from the recovered clock;
 wherein the VCO includes a plurality of $g_m$ (transconductance) cells;
 an amplitude detector that detects an amplitude of the recovered clock and that biases the plurality of $g_m$ cells of the VCO such that the each $g_m$ cell of the plurality of $g_m$ cells operates substantially within its linear operating region;
 wherein the loop filter is implemented as a LPF (Low Pass Filter) having a resistor and a capacitor connected in series such that the capacitor is shunted to ground;
 wherein a BPF (Band Pass Filter) control voltage is selected from a node that connects the resistor and the capacitor; and
 wherein the BPF control voltage determines a tuning frequency of a BPF to which the PLL is communicatively coupled.

2. The PLL of claim 1, wherein:
 the BPF is implemented as a $g_mC$ (transconductance-capacitance) filter that includes at least one additional plurality of $g_m$ cells; and
 the plurality of $g_m$ cells of the VCO and the at least one additional plurality of $g_m$ cells of the $g_mC$ filter both include substantially identical $g_m$ cells.

3. The PLL of claim 2, wherein:
 the tuning frequency of the BPF is substantially a center frequency of the BPF; and
 the BPF control voltage biases the at least one additional plurality of $g_m$ cells of the VCO such that the each $g_m$ cell of the at least one additional plurality of $g_m$ cells operates substantially within its linear operating region.

4. The PLL of claim 2, wherein:
 the substantially identical $g_m$ cells of the plurality of the plurality of $g_m$ cells and the at least one additional plurality of $g_m$ cells provide substantial immunity to environmental perturbation of the PLL and the BPF.

5. The PLL of claim 4, wherein:
 the environmental perturbation of the PLL and the BPF is at least one of a temperature change, a humidity change, and a change in a power supply voltage.

6. The PLL of claim 1, wherein:
 the input signal to the PFD has a frequency that is substantially a center frequency of the BPF.

7. The PLL of claim 1, wherein:
 the loop filter of the PLL substantially eliminates any spur or glitch content within the BPF control voltage.

8. The PLL of claim 1, wherein:
 the BPF control voltage is a continuous time analog voltage signal.

9. The PLL of claim 1, wherein:
 the PLL is implemented within an AFE (Analog Front End) of a communication device; and
 the communication device is a transceiver or a receiver.

10. A PLL (Phase Locked Loop) implemented to perform high precision continuous time BPF (Band Pass Filter) tuning, the PLL comprising:
 a PFD (Phase/Frequency Detector) that is operably coupled to determine a phase difference between transitions of a feedback signal and an input signal;
 a CP (Charge Pump) operably coupled to convert the phase difference into a charge pump current;
 a loop filter operably coupled to convert the charge pump current into a VCO (Voltage Controlled Oscillator) control voltage;
 a VCO (Voltage Controlled Oscillator) operably coupled to convert the VCO control voltage into a recovered clock, wherein the feedback signal is derived from the recovered clock;
 wherein the VCO includes a plurality of $g_m$ (transconductance) cells;
 an amplitude detector that detects an amplitude of the recovered clock and that biases the plurality of $g_m$ cells of the VCO such that the each $g_m$ cell of the plurality of $g_m$ cells operates substantially within its linear operating region;
 wherein the loop filter is implemented as a LPF (Low Pass Filter) having a resistor and a capacitor connected in series such that the capacitor is shunted to ground;
 wherein a BPF (Band Pass Filter) control voltage is selected from a node that connects the resistor and the capacitor;
 wherein the BPF control voltage determines a tuning frequency of a BPF to which the PLL is communicatively coupled;
 wherein the BPF is implemented as a $g_mC$ (transconductance-capacitance) filter that includes at least one additional plurality of $g_m$ cells;
 wherein the plurality of $g_m$ cells of the VCO and the at least one additional plurality of $g_m$ cells of the $g_mC$ filter both include substantially identical $g_m$ cells;
 wherein the input signal to the PFD has a frequency that is substantially a center frequency of the BPF;
 wherein the tuning frequency of the BPF is substantially a center frequency of the BPF; and
 wherein the BPF control voltage biases the at least one additional plurality of $g_m$ cells of the VCO such that the each $g_m$ cell of the at least one additional plurality of $g_m$ cells operates substantially within its linear operating region.

11. The PLL of claim 10, wherein:
 the substantially identical $g_m$ cells of the plurality of the plurality of $g_m$ cells and the at least one additional plurality of $g_m$ cells provide substantial immunity to environmental perturbation of the PLL and the BPF.

12. The PLL of claim 10, wherein:
 the BPF control voltage is a continuous time analog voltage signal.

13. The PLL of claim 10, wherein:
 the loop filter of the PLL substantially eliminates any spur or glitch content within the BPF control voltage.

14. The PLL of claim 10, wherein: the PLL is implemented within an AFE (Analog Front End) of a communication device; and the communication device is a transceiver or a receiver.

15. A method for performing continuous time tuning to a BPF (Band Pass Filter), the method comprising:

oscillating a VCO (Voltage Controlled Oscillator) of a PLL (Phase Locked Loop) at a center frequency of a BPF (Band Pass Filter), wherein the PLL is communicatively coupled to the BPF;

adjusting an amplitude of an output of the VCO to ensure that each $g_m$ (transconductance) cell of a plurality of $g_m$ cells of the VCO operates within its respective linear region;

selecting an BPF control voltage from a loop filter of the PLL; and providing the selected BPF control voltage from the loop filter of the PLL to the BPF thereby tuning the BPF to operate at its center frequency.

16. The method of claim 15, wherein:

the BPF is implemented as a $g_mC$ (transconductance-capacitance) filter that includes at least one additional plurality of $g_m$ cells; and the plurality of $g_m$ cells of the VCO and the at least one additional plurality of $g_m$ cells of the $g_mC$ filter both include substantially identical $g_m$ cells.

17. The method of claim 16, wherein:

the substantially identical $g_m$ cells of the plurality of the plurality of $g_m$ cells and the at least one additional plurality of $g_m$ cells provide substantial immunity to environmental perturbation of the PLL and the BPF.

18. The method of claim 16, further comprising:

operating each $g_m$ cell of the at least one additional plurality of $g_m$ cells of the BPF substantially within its linear operating region.

19. The method of claim 15, wherein:

the loop filter of the PLL is implemented as a LPF (Low Pass Filter) having a resistor and a capacitor connected in series such that the capacitor is shunted to ground; and further comprising:

selecting the BPF control voltage from a node that connects the resistor and the capacitor.

20. The method of claim 15, wherein:

the method is performed within a communication device; and the communication device is a transceiver or a receiver.

* * * * *